United States Patent [19]
Chu et al.

[11] Patent Number: 5,394,299
[45] Date of Patent: Feb. 28, 1995

[54] TOPOLOGY MATCHED CONDUCTION COOLING MODULE

[75] Inventors: Richard C. Chu; Michael J. Ellsworth, Jr.; Robert E. Simons, all of Poughkeepsie; David T. Vader, New Paltz, all of N.Y.

[73] Assignee: International Business Machines Corporation, Armonk, N.Y.

[21] Appl. No.: 242,658

[22] Filed: May 13, 1994

Related U.S. Application Data

[63] Continuation of Ser. No. 994,389, Dec. 21, 1992, abandoned.

[51] Int. Cl.6 .............................................. H05K 7/20
[52] U.S. Cl. ....................................... 361/705; 165/79; 165/80.4; 257/707; 257/719; 361/699; 361/719
[58] Field of Search ............... 62/259.2; 165/79, 80.3, 165/80.4, 142, 908, 104.33; 174/15.1, 16.1, 16.3; 253/706, 707, 710, 713, 714, 718, 719, 723; 361/689, 690, 692, 699, 702, 704, 705, 715, 716, 718, 719

[56] References Cited
U.S. PATENT DOCUMENTS

| | | | |
|---|---|---|---|
| 4,034,468 | 7/1977 | Koopman | 29/628 |
| 4,069,498 | 1/1978 | Joshi | 357/81 |
| 4,193,445 | 3/1980 | Chu et al. | 165/79 |
| 5,005,638 | 4/1991 | Goth | 165/80.4 |
| 5,097,385 | 3/1992 | Chu et al. | 361/382 |
| 5,195,020 | 3/1993 | Suzuki et al. | 361/385 |
| 5,309,319 | 5/1994 | Messing | 361/699 |

OTHER PUBLICATIONS

Integrated Module Heat Exchanger, IBM Tech Discl Bull vol. 20 No. 11A, Apr. 1978, p. 4498, Antonetti.
IBM Technical Disclosure Bulletin, vol. 12, No. 10, p. 1665, Mar. 70 A. H. Johnson et al.
IBM Technical Disclosure Bulletin, vol. 19, No. 4, p. 1348, Sep. 1976, D. A. Jeannotte.

*Primary Examiner*—Gerald P. Tolin
*Attorney, Agent, or Firm*—Lawrence D. Cutter; Laurence R. Letson

[57] ABSTRACT

The pistons of a cold plate frame orient themselves as a result of being free to move along one axis and about two other axes by the reflowing of solder tinning on the external surfaces of the pistons and the walls of the recesses within which the pistons reside. As the pistons are permitted to move freely under a biasing force during the solder reflow the face of the piston will engage with the top surface of an electronic chip against which the piston is engaged. The cooling of the solder after reflow will freeze the position and orientation of the piston to that of the electronic chip and will permit enhanced cooling. The cold plate may be disassembled from and reassembled with the components of the cooling system and the electronic chips while maintaining significantly enhanced cooling capabilities.

13 Claims, 6 Drawing Sheets

TOPOLOGY MATCHED CONDUCTION COOLING MODULE

CROSS-REFERENCE TO RELATED APPLICATION

This application is a continuation of application Ser. No. 07/994,389, filed Dec. 21, 1992, now abandoned.

FIELD OF THE INVENTION

This invention relates to the cooling of electronic components and electronic assemblies, as in computers, and more particularly to the cold plate of a cooling device which may be customized to accommodate the planar mismatches of electronic chips on a support substrate.

RELATED INVENTION APPLICATION

This invention is related to an invention disclosed in application Ser. No. 07/994,581, filed Dec. 21, 1992, on even date herewith, entitled "Intersecting Flow Network For A Cold Plate Cooling System", by Richard C. Chu, et al., and commonly assigned herewith, and now abandoned.

BACKGROUND OF THE INVENTION

Electronic assemblies are comprised of many devices in the larger or main frame computers, including logic and memory chips, which are attached to common chip support substrates. A chip support substrate carries on its surface the necessary circuit patterns for conducting signals to and from the chips mounted onto the substrate. In addition to the circuit patterns on the substrate surface, also there may exist a plurality of attachment points or pads formed onto the surface of the substrate. These pads permit soldering the termination pads of the logic and/or memory chips to the electrical circuit patterns on the chip support substrate.

Typically, this attachment of the logic and memory chips to the substrate is accomplished by small solder balls formed on the termination pads of the logic or memory chip. This attachment technique is well known as a part of the C4 solder process. Once the substantially uniform diameter solder balls have been formed on the termination pads of the electronic chip, this chip may be placed over the appropriate termination pads of the electrical pattern on the substrate and the solder reflowed to make the connection and bridge between the termination pads on the chip and the chip support substrate.

When the solder balls initially are formed on the electronic chips or the chip support substrate, there will be inherent variations in the amount of solder in each of the solder balls, notwithstanding the best efforts to maintain uniformity. In addition, the thickness of the several chips will vary slightly since the chips are made from different silicon slices. These variations cause problems in cooling of each chip, because the top surface of all the chips will not be uniformly co-planar.

Thus, to a very large extent, the orientation of the chip with respect to the chip support substrate is controlled by the surface tension of the liquid solder during solder reflow and by the volume of solder of each solder ball. Accordingly, the height of the exposed surface of the electronic chip from and the orientation of the exposed surface of the chip with respect to the top surface or the circuit surface of the chip support substrate is largely dependent upon the solder surface tension and the volume of solder of each ball.

Additionally, there may exist variations in the thickness of the chip itself from one edge to the other; these variations will influence the orientation of the top or exposed surface of the electronic chip relative to the circuit surface of the chip support substrate. With all these variables, in all probability, the exposed or top surface of the electronic chip will not be parallel and/or at a uniform height with all the other surrounding chips relative to the circuit surface of the chip support substrate.

It has also been found that it is virtually impossible to reliably orient all the exposed or top chip surfaces so that they are parallel to the exposed circuit surface of the chip support substrate.

As a result of this non-uniformity, the use of a single flat plate to cool the chips during operation is hampered by the inability to place a single planar surface over a plurality of the chips and accomplish intimate, surface-to-surface contact with all the chips.

As the circuit density within the chips increases, a result of the placement of larger numbers of integrated circuits onto the electronic chips, more heat is generated and concentrated in the chips. The heat must be efficiently and reliably removed from the chips in order to maintain the chips in an efficient operating condition.

To accomplish this heat removal, thermal conduction cooling modules have been designed to engage the exposed surface of the electronic chips with members which are highly heat conductive. The members are contained within a frame or framework which biases the members against the surface of the chips. This framework also provides a thermally conductive path to carry the heat away from the electronic chips, thereby cooling the chips.

Contact between the engaging member and the chip becomes either a point contact or a line contact. If the engaging member contacts the chip's exposed surface, has a planar surface, is constrained to move only in an axial direction generally perpendicular to the plane of the chip and if the chip is tilted slightly, the heat transfer through this engagement is seriously degraded from that desired and, accordingly, efforts have been made in the past to overcome the effect of tilted chips. Early attempts at conforming the heat conductive member to the tilted orientation of the chips have included: the assembly of the chip and its package with a relatively large mass of low melting point solder positioned between the package and the exposed surface of the electronic chip, illustrated in U.S. Pat. No. 4,034,468 to Koopman, and commonly assigned with this application. After complete assembly of the package and electronic chip into a module, the solder then is reflowed and allowed to "ball up" due to surface tension and gravity; the effect being that the ball of solder then will sag and come into contact with either the chip or the package, depending upon the orientation of the elements of the module and the pre-reflow position of the mass of solder. At least one of the junctions between the solder and one of its adjacent engaging surfaces is not a bonded interface; accordingly, when cryogenic cooling is used, the varying coefficient of thermal expansion of the different materials may degrade the heat transfer across the unbonded surface or create stresses on the chips, leading to breakage.

One approach to permanent thermal connections of the electronic devices to the heat dissipating members includes the use of solders to metallurgically bond the electronic device to the heat sink, such as is described in the *IBM Technical Disclosure Bulletin* entitled "Chip Heat Sink Package Assembly" by A. A. Johnson, et. al., Volume 12, No. 10, March 1970, page 1665. Additionally, the use of a liquid gallium heat transfer layer in a circuit module is disclosed in *IBM Technical Disclosure Bulletin*, Volume 19, No. 4, September 1976, page 1348, entitled "Circuit Module With Gallium Metal Cooling Structure" by D. A. Jeannotte.

Later attempts to design conduction cooling modules to cool a plurality of electronic chips have resulted in the use of compliant pistons contained within a frame each within its own cylinder and biased against the electronic chip, as illustrated in U.S. Pat. No. 4,193,445 to Richard C. Chu, et. al., and commonly assigned with this application.

A further effort to enhance heat transfer from the chip to the cold plate resulted in pistons shaped with a slight taper on both ends to allow tilting of the piston within the cylinder of the cold plate. This addressed the piston/chip interface, but did not solve the gap/barrier to heat conduction from the piston to the cold plate. Filling the gap with an oil helps but is still inefficient. The tapering of the piston allows the piston to tilt or shift in a cylinder which is more nearly the same diameter as the piston, reducing the gap and enhancing heat transfer across the gap.

The pistons and cold plate cylinders typically require close tolerances to have satisfactory heat conductivity. A gap between the piston and cylinder generally must be not greater than 0.001 inches or 0.025 mm, in this environment.

U.S. Pat. No. 4,193,445 addresses the problem of tilted electronic chips by formation of the head or engaging surface of a spring biased piston into a partially spherical shape whereby the partially spherical surface of the piston will engage the exposed surface of the electronic chip regardless of the chip tilt or orientation. The piston of this patent is provided with a central bore extending to a channel arrangement on the spherical face, whereby a wax having thermally conductive properties may be loaded into the central bore of the piston. When heated, the wax will flow downward toward the face of the chip effectively providing a bond between the piston and the chip, thereby filling the area between the piston face and the exposed surface of the chip to enhance thermal conductivity from the chip to the piston. The annular interface between the piston and the cylinder wall likewise is filled with the melted thermal wax, upon reflow, to prevent rebound of the piston from the chip face and to enhance thermal conductivity to the cylinder walls.

SUMMARY OF THE INVENTION

It is an object of the invention to improve the heat transfer from an electronic chip to a cooling frame.

It is a further object of the invention to permit direct cooling of the pistons in a thermal conduction module by means of a cooling fluid.

It is an additional object of the invention to provide a customized engagement of the cold plate of a thermal conduction module with the chips being cooled, thereby accommodating any tilt or misalignment of the surface of the chips with a plane perpendicular to the axis of the pistons or any chip to chip height variations.

Another object of the invention is to provide a cold plate that may be recustomized following rework of the electrical package.

The disadvantages of the prior art are overcome and the objects of this invention accomplished by the present invention as will be seen from the following summary description.

SUMMARY OF THE INVENTION

A cold plate that is to be used to cool multiple electronic chips on an electronic chip support substrate is typically comprised of a frame or plate of some substantial thickness through which cooling channels may pass. The cooling channels permit the circulation of a refrigerant or a cooled liquid, such as water, through the channels to absorb and transport heat from the cold plate to some region where the heat may be rejected, either into another thermal medium or the outside ambient atmosphere.

The cold plate desirably is provided with a plurality of pistons contained within recesses or cylinders in the cold plate structure. The pistons may have a variety of cross sections such as rectangular, square, oval or circular, as the needs of the designer dictate. Preferred cross-sections are circular with either a single or double taper on the piston.

Naturally, the recesses within the cold plate will require a cross section substantially the same as the cross sectional shape of the pistons. The pistons are dimensioned slightly smaller than the recesses so that they not only move within the recess along the axis of the piston under some biasing force, but also so that the piston may tilt slightly to accommodate the mismatches of the planar exposed surfaces of the electronic chips supported by the electronic chip substrate. Also the gap between the pistons and their cylinders may be opened to a gap of 0.005 inches to 0.010 inches (0.125 to 0.250 mm). The additional clearance between the recess wall and the wall of the piston will permit the piston movement along a Z axis to bring the engaging face of the piston into contact with at least some portion of the electronic chip; then this additional clearance will allow the piston to orient itself through rotation about the X and Y axes, thereby engaging the engagement surface with the exposed chip surface in intimate face-to-face engagement. The side walls of the recess and the exterior walls of the piston may be tinned or coated with a thin layer of solder. Then the piston may be assembled with the cold plate frame. When positioned over the electronic assembly to which the cold plate frame and pistons are to be adapted, the solder is reflowed, permitting movement of the pistons, not only along the Z axis, but also about the X and Y axes. Thus the piston may orient itself to the surface of the chip while the solder is still in a molten state. Thereafter, the solder is allowed to solidify capturing the piston in the desired orientation. The gap between the piston and the recess walls is sufficiently small that the solder is retained through capillary action during the period of time the solder is in a molten state. The orientation and subsequent position of the piston relative to the electronic chip with which it will engage occurs while the solder is molten and thus permits relatively free movement of the piston. Using a compliance tool, the piston may be spring loaded to urge the piston toward the substrate and the electronic chip. Upon the cooling and solidification of the solder, the piston is captured in the proper orientation. The electronic chip support substrate and chips may be removed from the cold plate for further manufacturing operations and subsequently rejoined with the cold plate assembly the orientation of the chips and the orientation of the respective pistons will not have changed.

Should it be desired to use a thermally conductive paste to fill the interface between the pistons and the electronic chip, appropriate dimensional accommodations may be made during the preliminary assembly and orientation phase; at which time, the pistons will be oriented and spatially positioned so that a thin layer of thermally conductive paste may be interposed between the chip and the piston.

Once the piston is trapped by the resolidified solder, an excellent conduction path is established between the wall of the piston and the cold plate frame. This technique may be utilized in a cold plate if refrigerants or gases are used to cool and if the pistons are hollow cups into which nozzles are inserted to spray or to impinge either a cold liquid or a cold gas onto the interior surfaces of the cups. The cups are oriented in an analogous fashion to that described above and soldered to the cold plate frame. This attachment approach serves not only to position the cup with respect to the electronic chips with which the cup is engaged to cool, but also to seal passageways, preventing the escape of the cooling medium.

A more complete understanding of the invention may be had by referring to the drawings described below and the detailed description of the best mode contemplated for carrying out the invention, to follow.

DETAILED DESCRIPTION OF THE PREFERRED EMBODIMENT OF THE BEST MODE CONTEMPLATED BY THE INVENTOR FOR CARRYING OUT THE INVENTION

Figure 1:
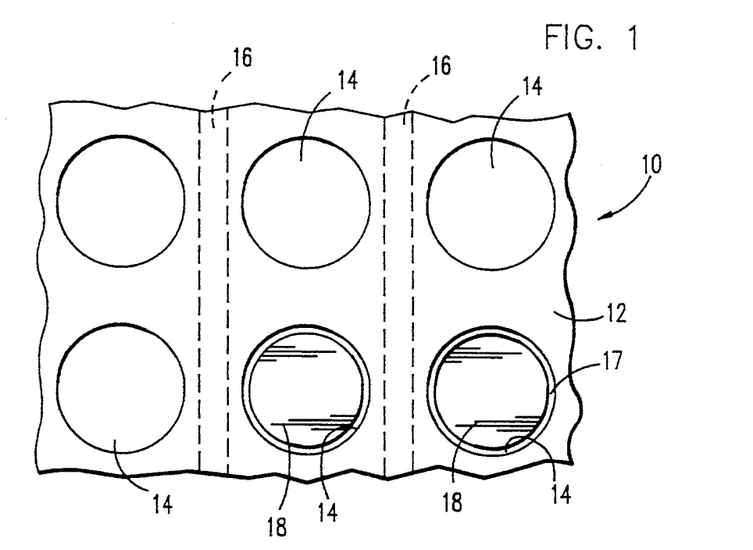
FIG. 1 is a view of the cold plate frame and recesses in a cylindrical shape, together with pistons inserted into some of the recesses.

A cold plate 10 is illustrated in FIG. 1 as a segment of a complete assembly but showing cylindrical recesses 14 in the cold plate frame 12. Inserted into these recesses 14 are pistons 18 which are free to move within the confines of recesses 14.

It should be appreciated that the cross-sectional shape of the recesses 14 and pistons 18 are not limited to a circular shape but rather may be oval, rectangular, square or any other desired shape so long as the other requirements of the invention may be met. The illustration in FIG. 1 of a circular recess or cylinder 14 and a circular piston 18 is for convenience and the preferred embodiment of the best mode.

Contained within cold plate 12 are passages 16 through which a cooling liquid such as chilled water may be passed to acquire the heat energy absorbed by cold plate 12 when the electronic system is operating.

The cooling fluid is then transported to some area or device which will then effectively reject the heat from the electronic system. These liquid cooling flow channels and systems contained within the cold plate assembly will be described in more detail later.

Figure 2:
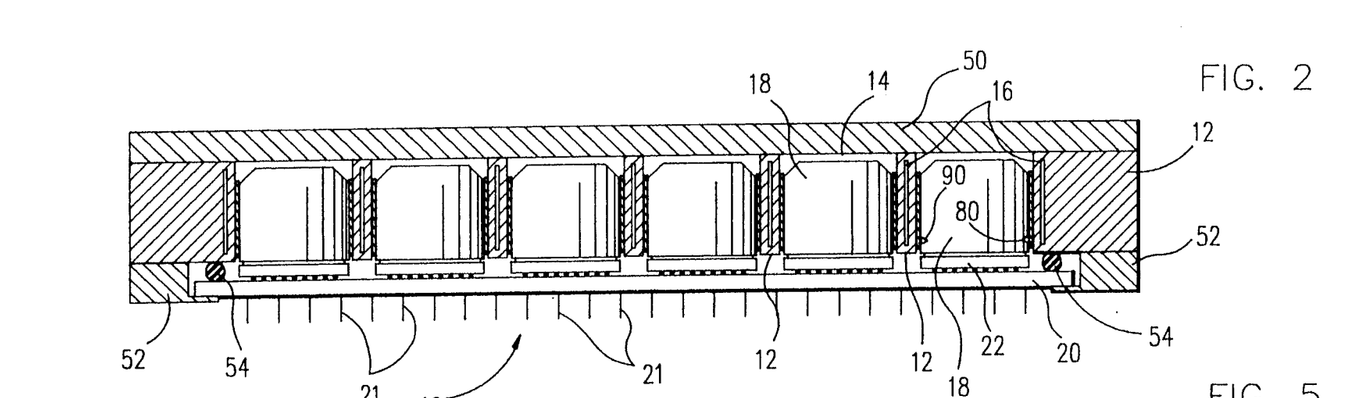
FIG. 2 is a cross-sectional view of a cold plate frame, assembled with a cover, the pistons in their final oriented position and electronic support substrate and chips all positioned to be engaged with the engagement face of the pistons.

FIG. 2 illustrates a cross-section of a thermal cooling module which incorporates therein a cold plate frame 12 which is similar to the cold plate frame 12 of FIG. 1, except that it may accommodate cross-sectional cavities or recesses 14 having shapes other than the circular shape illustrated in FIG. 1. Cold plate 12 is shown with cooling channel 16 extending through portions of the cold plate 12 closely adjacent to the walls of recess 14. As the cooling medium is passed through channels 16, it will absorb heat from the cold plate 12. The cooling of the cold plate 12 will create a heat sink to which the heat generated in electronic chips 22 will flow by conduction. Pistons 18 are illustrated as positioned in contact with and oriented with the surface of chips 22 and soldered to walls of recess 14 to form a customized cold plate 12 unique to the electronic chips 22 and the chip orientation on the chip support substrate 20. Plate 50 is shown attached to cold plate 12 solely for the purpose of closing the open ends of recess 14 and providing some protection against contaminants entering the cold plate 12.

In its final assembly, the cold plate 12, is sealed to the substrate 20 by means of a sealing O-ring 54 forcibly engaged between cold plate 12 and substrate 20. The substrate 20 is retained in that position by means of a retaining or clamping ring 52. The electronic circuits necessary to connect other components of the computer assembly (not shown) to the electronic chips 22 may extend, in pin form, from the electronic substrate 20, as illustrated by pins 21.

Figure 3:
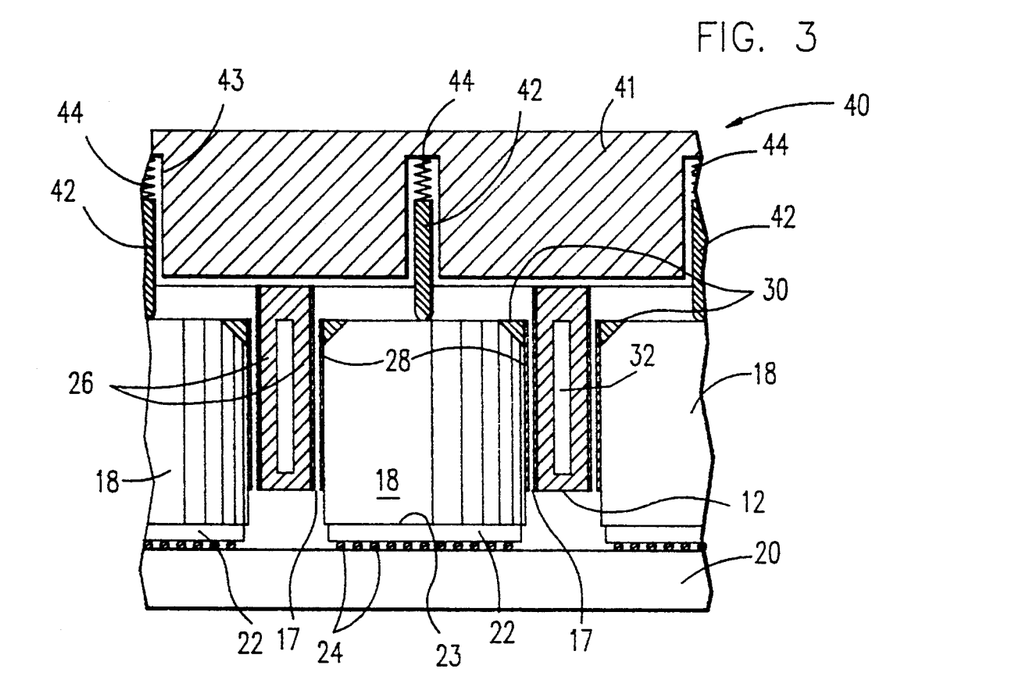
FIG. 3 is an enlarged and more detailed view of the components of the assembly in FIG. 2, illustrated prior to the reflow of solder and with a compliance tool engaged with the cold plate frame and pistons.
Figure 4:
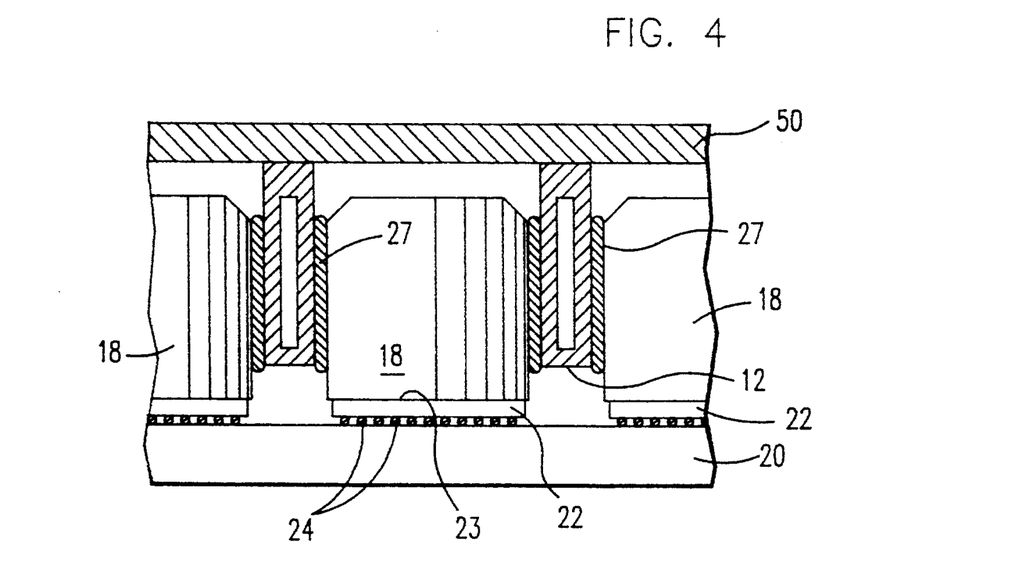
FIG. 4 illustrates the final assembly of the cold plate substrate and electronic chips.

In order to produce a completed assembly as illustrated in FIG. 2, it is beneficial to understand the assembly process and for that purpose, reference to FIG. 3 is made. The substrate 20 is illustrated carrying thereon electronic chips 22 which are bonded to the substrate 20 by solder connections 24.

The solder connections 24 are one source of possible misalignment of the electronic chip top surface 23. As the solder balls 24 are formed onto the substrate 20, every effort is made to assure that all the balls 24 on each particular substrate 20 contain the same volume of solder. However, as the manufacturing process parameters may vary, it is possible that some of the solder balls 24 will not have equal volumes. Accordingly, when the chip 22 is attached to substrate 20 and the positioning of the chip 22 is at least partially dependent upon the surface tension of the molten solder, the chip 22 may be canted or tilted to some small amount or degree with respect to the top surface of substrate 20. Further, individual chips 22 may have been manufactured from silicon wafers of varying thickness causing the surfaces to be engaged by pistons 18 to vary in height from the substrate 20. Accordingly, there exists a need to accommodate such variations.

Inasmuch as precise parallelism and uniform heights are impossible, when piston 18 is forced against chip surface 23, the piston 18 will translate to the chip 20 and will engage surface 23 at a single point typically or along a single line.

Prior to the customization step, walls of recesses 14 are precoated or tinned with a solder. The tinning of the walls of recess 14 may be accomplished by any conventional solder tinning process; i.e., dipping the entire cold plate frame 11 into molten solder, spraying molten solder onto the walls of recess 14, plating solder onto the walls of recess 14, or by any other desired process. The only requirement being that the walls of recess 14 have been coated with a thin layer of solder having a lower melting point than the melting point of the solder connections 24.

Likewise, each individual piston 18 is tinned or coated with the same solder over a substantial portion of its exterior. Further, the piston 18 may have had deposited on it an additional quantity of solder 30 as a solder preform which may reside in a chamfered region on the piston 18. This deposition of solder 30 may be accomplished by forcing a piston 18 into a mold which contains molten solder or into which molten solder may be poured, the solder would be allowed to solidify, and then the mold would be removed from the piston. Alternatively, a preformed quantity of solder in the form of an annular ring that will bit in the chamfer annulars may be used to supply the additional solder 30 necessary.

After the piston 18 has been inserted into recess 14, a compliance tool 40 is attached to the cold plate 12. The compliance tool 40 typically will include a plate member 41 with a plurality of cylinders 43 or holes 43 formed therein. Inserted into the cylinders 43 are springs 44 and pistons 42. The pistons 42 preferably are provided with a rounded, spherical, or partially spherical surface on one end of the piston 18, in turn which will engage with the top surface 23 of chip 22. With the compliance tool 40 clamped or otherwise attached to the cold plate 12 and the electronic support substrate 20 and chips 22 likewise in engagement with the cold plate 12, the cold plate 12 then is ready for the solder reflow operation.

Solder reflow may be accomplished by heating the entire assembly 10 to a temperature which exceeds the melting point of the solder alloy 30 on the tinned surfaces 28 and 26 of the piston 18 and recess 14, respectively, but lower than the melting temperature of solder connections 24 on chips 22. Piston 18 then is free to move downward under the influence of spring 44 into engagement with the top surface 23 of electronic chip 22. As the piston 18 meets resistance from surface 23, spring 44 will continue to urge the piston 18 down and against surface 23. With the solder on the tinned surfaces 26 and 28 in a liquid state, resistance to movement of the piston 18 is provided only by the electronic chip 22. With an engagement between piston 18 and surface 23, typically either in a point or line engagement, in all probability being offset from the center line of piston 42, a force couple will be generated which will tend to rotate piston 18 around the X and Y axes of the piston, as will be more fully explained with respect to FIG. 7. Multiple pistons 42 could engage a single piston 18 to create a force movement in all situations.

The piston 18 will orient itself to be in contact over substantially all of the surface 23 of electronic chip 22. Such orientation will necessitate the rotation of piston 18 in such a way that the top of the piston 18 will move either left or right as illustrated in FIG. 3, and will approach one of the previously tinned walls 26 of recess 14; the other side of the piston will tend to move away from one of the walls 26. Likewise, there may be some lateral shifting of the piston 18 at the lower extremities thereof; accordingly, the gap 17 between the tinned surfaces 26 and the tinned surfaces 28 of the piston may narrow or widen as required by the force couple generated by spring 44 and chip surface 23. One significant advantage of this invention is the gap 17 between the piston 28 and cylinder 26 may be increased from a typical 0.001 inches in the prior art to about 0.005 to 0.010 of an inch. This reduces manufacturing cost, permits enhanced piston 18 alignment with the chip 22, and still creates a gap 17 sufficient to hold the solder.

To further contain the solder 30 in the piston 18/cylinder 14, gap 17, a circumferential groove 90 may be formed into the piston 18 near the point along the cylindrical surface where the cold plate 12 will engage the piston 18, so that any excess solder 30 may be pulled into the groove 90 at the time of solder reflow. This groove 90 is illustrated in FIG. 2.

Thereafter, the assembly is permitted to cool, thus solidifying the molten solder. During the molten stage, the relatively close clearance between piston 18 and cold plate frame 12 will result in the wicking or pulling of the solder 22 resident in region 30 into the gap 17 between the piston 18 and cold plate frame 12. As the solder 30 solidifies between piston 18 and cold plate frame 12, the piston 18 is frozen in position in the orientation necessary to engage surface 23, as is desired. Further and very important, a good thermal junction is formed between piston 18 and cold plate frame 12 to convey heat acquired by piston 18 to the cooling medium circulating in the cooling channel 32.

After cooling, the substrate 20 and electronic chips 22 resident thereon may be removed for further assembly operations, and the compliance tool 40 is removed for reuse on additional assemblies 10.

When final assembly is desired, substrate 20 together with chips 22 are repositioned underneath and in engagement with the pistons 18 of the cold plate assembly 12. Since neither the chips 22 nor the piston 18 surfaces have been permitted to move since disassembly, each of the surfaces should mate properly and perfectly with the complementing surface on the other portion.

A cover 50 is attached to the cold plate 12 for reasons described above. The entire assembly 10 is then clamped or fixed together in any conventional desired manner to hold all of the elements in position. During the final assembly phase, should it be desired to include a thermal conducting paste or oil between the piston 18 and the surface 23 of electronic chip 22, the paste may be applied and then as the elements are assembled, excessive paste will be squeezed out of the interface between piston 18 and chip 22. Alternatively, the region surrounding chips 22 and between substrate 20 and the cold plate 12 may be pumped full of the conductive paste. Oil may be used for very small gaps, while pastes are used in larger gaps.

Should paste be contemplated in the final assembly, it is preferable to accommodate that paste 118 by positioning substrate 20 and chips 22 slightly closer than is ultimately contemplated to the cold plate frame 12 during the solder reflow operation. Then upon final assembly, substrate 20 and chips 22 are positioned a minute distance farther away from pistons 18 then during customization, thereby providing a space or gap 21 for the thermal conductive paste 118.

Figure 5:
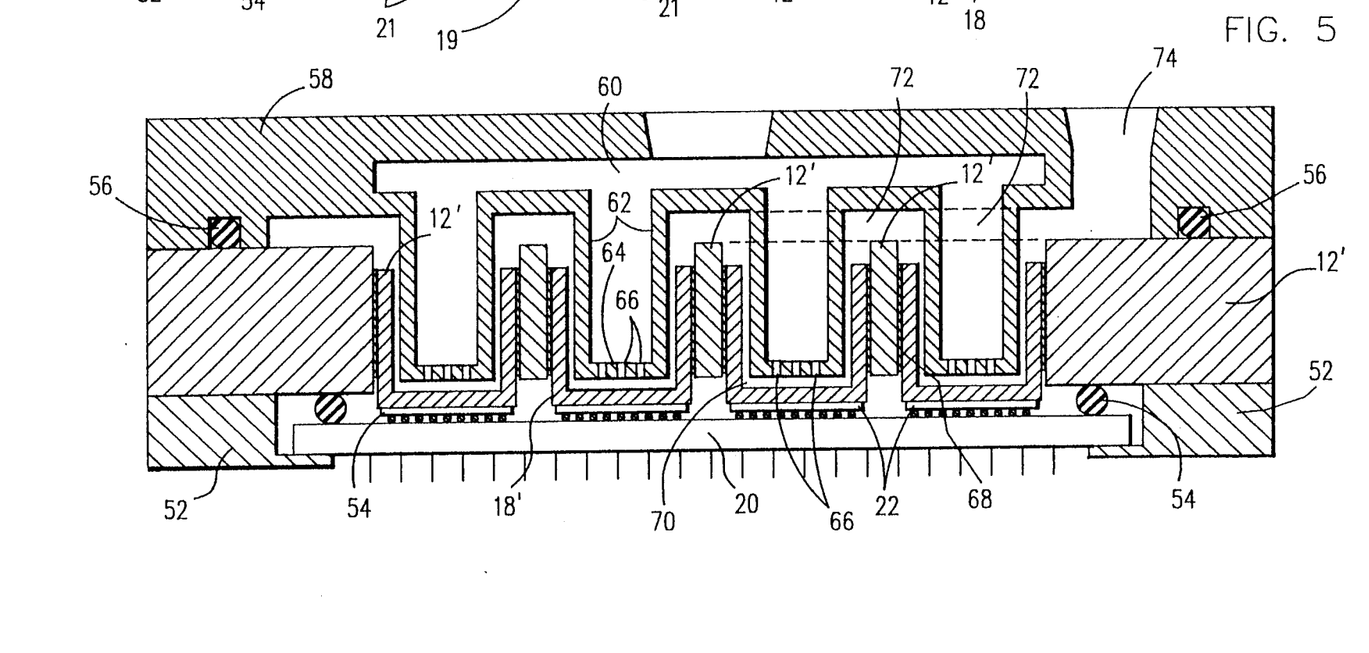
FIG. 5 illustrates an alternative embodiment whereby a cold gas or liquid is used to perform the heat transportation function and whereby the cooling fluid is sprayed or impinged onto the interior surfaces of the pistons to acquire the heat of the piston and to transport it away from the cold plate.

With this understanding of the process and desirability for orienting each of the pistons 18 to its own unique position as dictated by chips 22, and freezing each piston 18 and piston surface(s) into the cold plate 12, reference is now made to FIG. 5 wherein an alternative cooling approach is illustrated.

In FIG. 5, cold plate frame 12' is similar to the cold plate 12 of the previous figures with the exception that no cooling passages are provided in the cold plate frame 12', as previously described.

Instead, pistons 18' are formed in the shape of cups which fit, as previously described for the pistons 18, into recesses 14' formed in cold plate frame 12'. The cups 18' and the cold plate frame 12' are solder tinned, as previously described. The cups 18' are urged toward the chips 22 by a device analogous to the compliance tool 40 illustrated in FIG. 3, and the solder 30 reflowed.

Once solder bonds 68 have been formed between the cups 18' and cold plate frame 12', the tool urging the cups 18' would be removed. Upon final assembly, a manifold plate 58 is provided in lieu of cover plate 50. Manifold plate 58 is fabricated to provide passages 74 for a cooling fluid and a series nozzles 64 in a portion of the manifold plate 58 which extends down into the interior of cups 18'. Each nozzle 64 is further provided with orifices 66 or jets 66 that so cooling fluid impinges onto the interior surface of the cups 18'. The preferred fluid is chilled water, but liquid nitrogen or other fluids may be used.

The manifold plate 58 is fabricated to provide a gap or clearance between all portions of the nozzle structure 62 and the interior walls of cup 18'. When fully and finally assembled and sealed by O-rings 54 and 56, passages are formed and provided for the cooling medium to be introduced through the inlet manifold opening 60 from which the fluid may then flow into the nozzles 64 and through the orifices 66. As the cooling medium sprays through orifices 66 onto the interior portion of cup 18', the chilled fluid will acquire and absorb the heat contained within cup 18' and will pass generally upward between the nozzle 64 and the interior walls of cup 18', as illustrated in FIG. 5, until the fluid passes to the collector manifold 72; after collection in collector manifold 72, the cooling medium is carried to the outlet manifold 74. The circulation of the liquid or gaseous cooling medium or refrigerant is conventional outside the cold plate assembly 10 and, therefore, is not described in detail as it forms no part of this invention.

As one may appreciate, the attachment of the cups 18' to the cold plate frame 12 would enhance their stability, but attachment of cups 18' to cold plate frame 12' has no substantial affect on the heat transfer from the chips 22 to the outlet manifold 74. However, with each cup 18' oriented to the tilt/height of the respective chip 22, the heat transfer to the cup 18' from the chip 22 is greatly enhanced. In the embodiment shown and described with respect to FIGS. 1 through 4, the solder junction between the pistons 18 and the walls of cylinders 14 additionally provides an enhanced heat transport path. Cups 18' of FIG. 5 have enhanced heat transport characteristics inasmuch as they are oriented to a surface-to-surface engagement with chips 22. As was described with respect to the embodiment in FIGS. 1 through 4, a thermal paste can also be used between cups 18' and chips 22, if desired. Since the cup 18'/plate 12' interface is not used to transfer heat, the cold plate frame 12' can be a material such as plastic and the joining of the cup 18' to cold plate frame 12' may be accomplished by adhesives.

Figures 6, 7, 12:
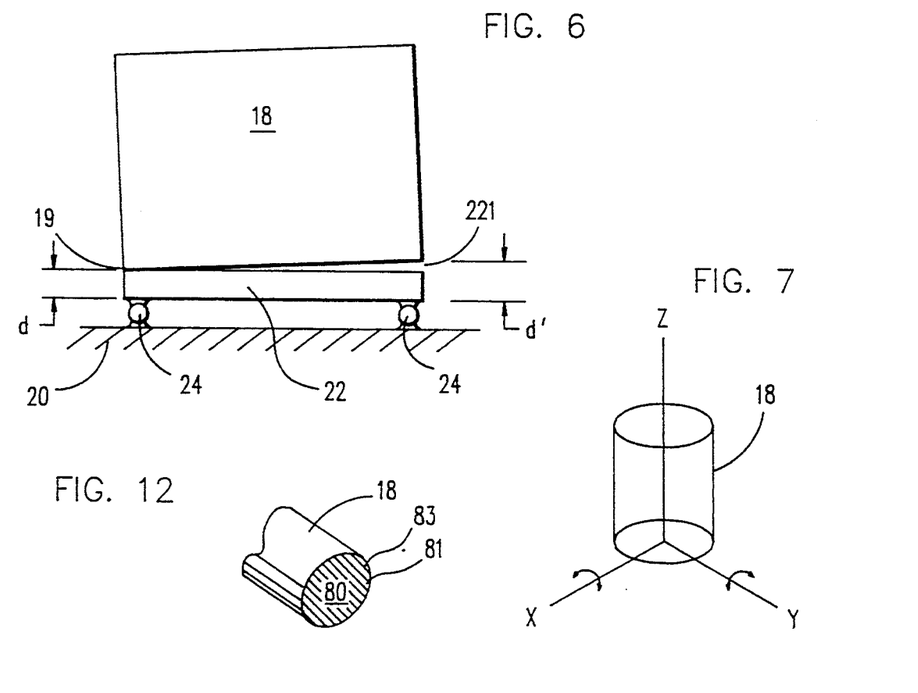
FIG. 6 is a diagram of a piston positioned in contact with an electronic chip, prior to the piston being oriented to engage the top surface of the chip with the engaging surface of the piston.
FIG. 7 is a diagram of a piston displayed on three axes and indicating the degrees of freedom of movement of the piston at the time of solder reflow.
FIG. 12 is a piston with the face having scores or grooves, to reduce the effective heat transfer through the piston face.

A better understanding of the positioning of the pistons 18 or cups 18' may be obtained from reference to FIGS. 6 and 7. In FIG. 6, the piston 18 is engaged at point 19 with chip 22. The solder connections 24 between chip 22 and substrate 20 have canted or tilted chip 22 such that the dimension of height d at the left edge of the chip 22 is slightly larger than the dimension of height d' at the right edge of the chip 22. This may be caused by a variation in the thickness of the electronic chip 22; however,in most cases, a variation of solder volume between the solder balls 24 at the left of the chip 22 and the solder balls 24 at the right edge of the chip 22 effects the orientation of the chip 22.

In any event until piston 18 or cup 18' is oriented appropriately, a wedge-shaped gap 21 is formed between piston 18, 18' and chip 22.

The thickness of the gap 21 at the right edge of the chip may be about 0.002 inches (50.8 microns).

With a piston 18' having an engaged length of approximately 0.8 inch or 20 millimeters, and a chip 22 width of approximately 0.8 inch (20 millimeters), it can be seen that if the recess 14 dimension corresponding to the width dimension of the piston 18' if other than a cylinder, and the diametrical dimension of recess 14 and piston 18 if cylindrical, must provide an approximate 50 to 60 micron difference between the two diameters. With such a difference, the piston 18 may orient itself properly, as described above, while at the time maintaining a gap 17 between piston 18 and recess 14 to attract and hold the liquid solder during the solder reflow operation. Diametral difference may be fabricated either by tapering the pistons 18 or providing a larger cylinder diameter. With the soldering of the pistons 18 to the cold plate 12, the differences in the diameters may be increased from about 0.001 inches (25.4 microns) to in the order of 0.010 inches (254 microns). Tolerance relief is desirable from a cost standpoint.

FIG. 7 illustrates a free body diagram of the piston 18 in cylindrical cross-section form, but the teaching is equally applicable to other cross-sectional shapes. As can be seen, the piston 18 may be forced downward along the Z axis. Upon engagement with chip 22 and the melting of the solder in gap 17, a rotation of the piston 18 by a small amount around X axis and Y axis orients the bottom face of piston 18 with the top surface 23 of chip 22.

It will be appreciated that should one of the chips 22 be removed from substrate 20 and a replacement chip 22 positioned and soldered thereon, the process of reorienting the piston 18 mating with the new replacement chip 22 must be accomplished. This may be a relatively easy accomplishment. Mere reassembly of the cold plate 12 and cups 18' or pistons 18 with the compliance tool 40 and the electronic assembly 19 and reflowing the solder permits the reorientation of the piston 18 engaged with the replacement chip 22. Other than reorientation of the piston 18, 18' as just described, the pistons 18, 18' will remain fixed spatially with respect to cold plate 12 and chips 22 and may be removed from engagement with chips 22 and reassembled.

Figure 8:
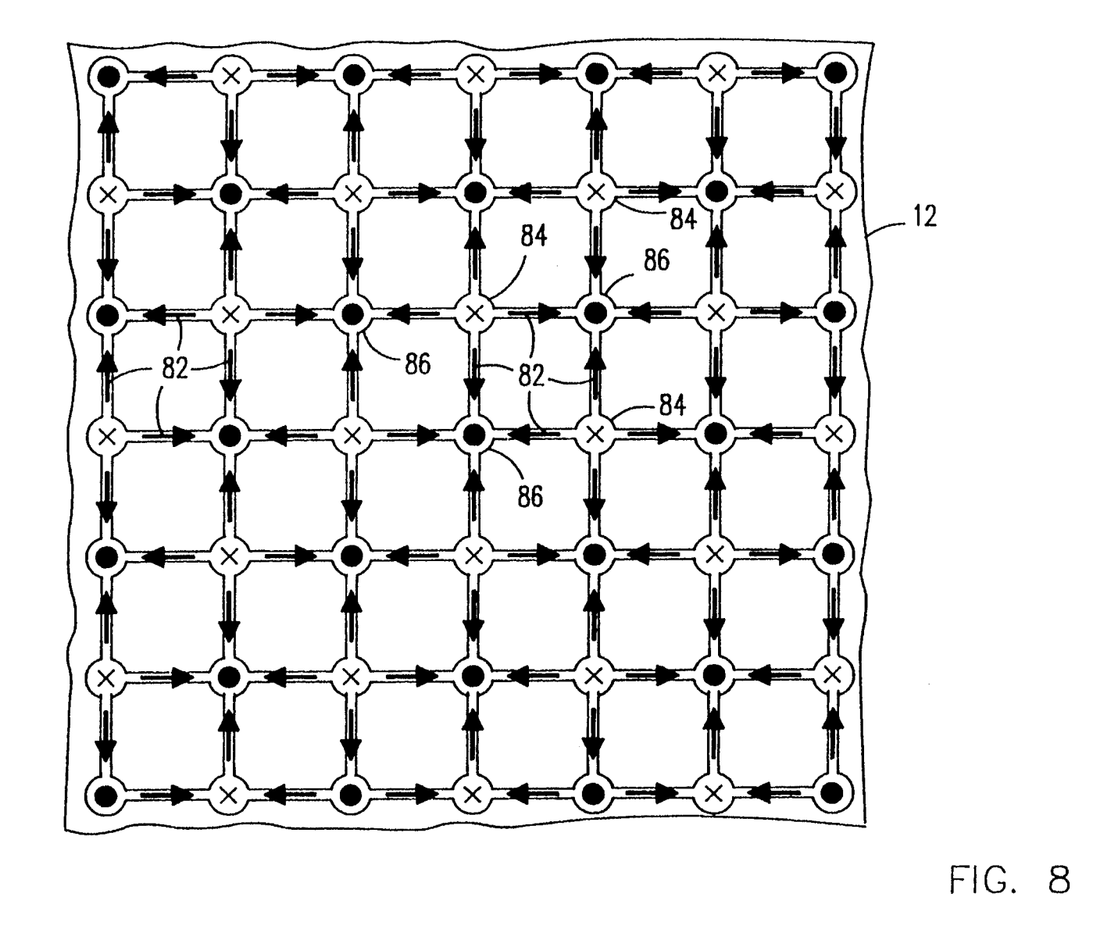
FIG. 8 is a diagram of an orthogonal flow network within a cold plate.

The preferred structure of cooling flow channels is illustrated in FIG. 8 and referred to as an Orthogonal Flow Network (OFN). The principle of the OFN is that the coolant is transported to a plurality of injection channels 84 and routed from a flow manifold 92 into the cold plate 12. A network of channels 82 within the cold plate 12 connect the injection channels 84 to the outflow channels 86. The network of lateral flow path 82 lengths between injection 84 and outflow 86 channels typically is approximately equal to the pitch between adjacent pistons 18. Accordingly, the flow length is short and the coolant will not become too warm to effectively cool the pistons 18; cooling efficiency is highest near the point of entry flow and the pressure drop is greatly reduced. Further, all pistons 18 will receive the cooling effect of cooling fluids that are approximately equal in temperature.

The flow channels 82 may be formed in plates that are assembled to form the supply or injection channels 84 and the collector or outflow channels 86. The cold plate 12 may be plates forming the lateral flow paths 82, injection channels 84 and outflow channels 86.

Figure 9:
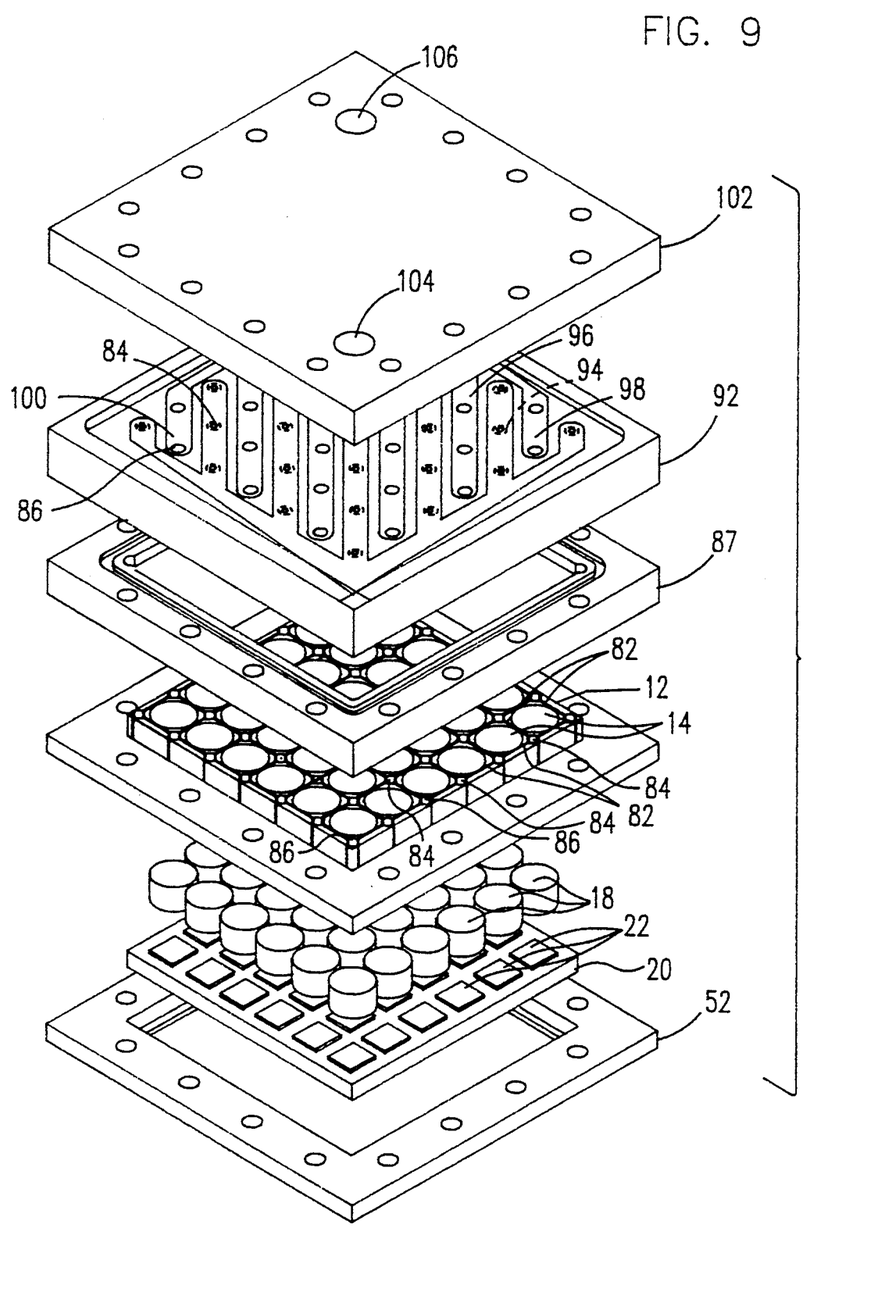
FIG. 9 is a view, in exploded form, of the cold plate assembly.

Referring now to FIG. 9, which is an exploded view of a complete assembly 10, substrate 20 supports chips 22. Pistons 18 are positioned above chips 22. Cold plate 12 is positioned above pistons 18 and cavities 14 are aligned to receive pistons 18.

Surrounding each cavity or cylinder 14 are the cooling flow paths 82. At the junctions of flow paths 82, holes 84, 86 are drilled coaxial to the intersection forming injection channels 84 and collector or outflow channels 86. Plate 87 acts to contain and close the ends of the lateral flow paths 82.

Manifold plate 92 is positioned over the injection channels 84 and outflow channels 86. The holes 94 drilled through the plate 92 communicate with the injection channels 84 and outflow channels 86. Formed into the top surface of plate 92 are supply manifold 94 and outflow manifold 96. The supply manifold 94 and outflow manifold 96 have passages 98, 100, respectively, connecting both injection channels 84 and outflow channels 86.

Cover plate 102 is provided with inlet port 104 and outlet port 106. Coolant introduced into inlet port 104 will pass through channels 98 to the injection channels 84 to circulate through cooling flow paths 82. After passing through flow paths 82, the coolant is collected by outflow channels 86 and then flowed to outflow manifold 96 through exit outlet port 106.

As described above, the cold plate 12 is assembled and soldered and then assembled and bolted together with manifold plate 92, cover plate 102 and clamp plate 52.

Alternative manifold plate 92 designs may be employed if desired.

Figure 10:
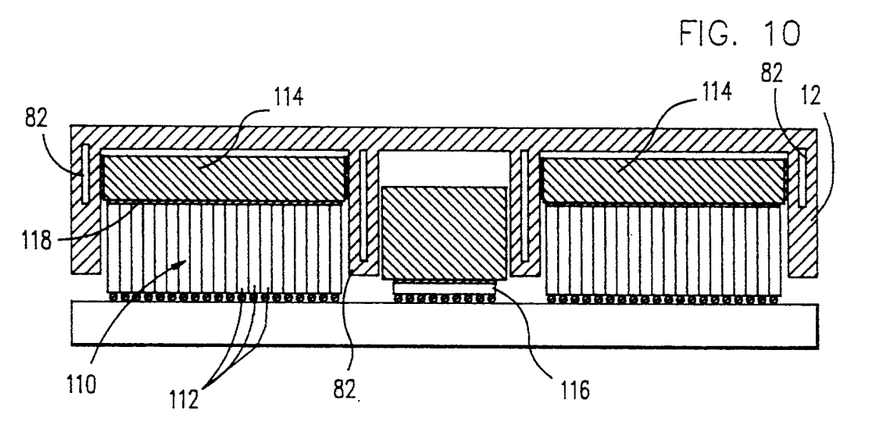
FIG. 10 is a sectional view through a cold plate assembly for cooling memory cubes as well as individual chips.

The technique of topology matching may be used in and is important to the cooling of memory cubes 110, as shown in FIG. 10. Memory cubes 110 are assemblies of a plurality of chips 112. A common piston 114 is positioned to engage the edges of the chips 112 forming the cube 110 and soldered, as previously described. Individual chips 116 may be cooled, as previously described.

Due to variations in height of the edges of chips 112, a thermally conductive paste 118 must reside at the piston 114/cube 110 interface to insure heat transfer to the piston 114.

Figure 11:
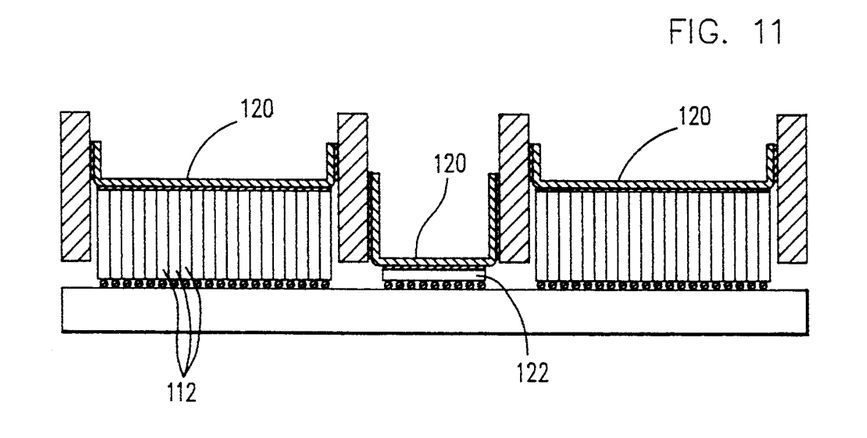
FIG. 11 is a sectional view of a cold plate assembly, as in FIG. 10, with cooling cups in lieu of pistons.

The use of cups 120, as shown in FIG. 11, may be substituted for pistons 114.

The spray arrangement of FIG. 5 is applicable to the cold plate 12", as illustrated in FIG. 11, with appropriate dimensional modification.

The cold plate 12" of FIG. 10 may have an appropriately dimensioned manifold plate 92 and cover plate 102 provided to complete the memory cube 110 cold plate assembly of FIG. 10.

Since it is desirable to operate the electronic chips 22 at approximately the same temperature, some accommodations must be made to balance the temperatures of different chips 22. For example, should a first chip 22 generate 25 watts of heat and a second chip 22 generate 50 watts of heat, and both chips 22 are cooled equally, the first chip 22 would be much colder and an imbalance in performance might occur.

To avoid such an imbalance, the flow of heat from the lower power chip 22 must be curtailed in a controlled fashion. FIG. 12 illustrates the face 80 of a piston 18 to be engaged with the lower power chip 22. The face 80 has been scored or grooved leaving raised surfaces 81 and recesses 83. The transfer of heat across the chip 22/piston 18 interface is dependent upon the surface area of the face 80 engaging the chip 22. By grooving or scoring the face 80, the engaging surface area of face 80 is reduced. For a 25 watt chip as in the above example, the surface area may be reduced to about 50% of the area of face 80. Surface modification may be accomplished by vapor blasting, scoring, grooving and blasting or knurling to cause recesses, surface interruptions or pits.

During final assembly of the entire cooling assembly 10, when the cold plate 12 in its customized state is positioned over and attached to substrate 20, the region around the chips 22 between pistons 22 and cold plate 12 and customized engagement faces 80 may be filled with a heat conduction fluid 118 such as an oil or a paste. The oil/paste 118 both serve to wet the faces 80 and chips 22 to insure an intimate contacting interface therebetween. The surfaces may be pre-coated or the material may be injected or inserted into the cavities and gap 221 region after positioning, whatever is found to be most advantageous. The oil interface gap 221 typically will be in the order of 1 to 5 microns while the paste interface gap 221 typically will be 25 to 125 microns in thickness.

While the heat conducting fluids of prior art designs have enhanced the heat conduction from the pistons 18 to the cold plate 12, the solder joint characteristics far exceed the heat conduction characteristics of the fluid 118 interface.

As an alternative to the soldering of pistons 18 into cold plate 12, a high viscosity thermally conductive paste may be disposed in the gap between pistons 18 and cold plate 12. With this arrangement when the cold plate is removed from engagement with the chips 22, the pistons 18 may realign upon reassembly.

An adhesive may be used to hold the pistons 18 in a fixed disposition relative to the cold plate 12 and thereby eliminate the solder plating and solder reflow requirements. If a cup 18' is used, the cold plate 12 may be made of injected molded plastic and the cups are sealed to the cold plate to from a fluid tight seal. When sealed, the cooling fluid may be circulated within the cup 18' and acquire heat directly from the cup 18'.

It will be appreciated that changes and modifications may be made to the invention described herein by one of skill in the are without departing from the spirit and scope of the invention as defined in the attached claims.

We claim:

1. A thermal conduction cooling module for cooling at least one electronic chip having an exposed face, said cooling module comprising:

a frame with at least one cavity having cavity walls extending from at least one surface of said frame into said frame;

at least one rigid piston, said piston having at least one planar face and positioned in said cavity with said planar face exposed and in direct face-to-face contact with said electronic chip;

said frame further including thermal conduction and transportation means for conducting heat from said piston and for transporting said heat so conducted away from said frame;

said rigid piston being oriented in said cavity with said planar face disposed parallel to and in direct face-to-face contact with said exposed face of said electronic chip, and said piston and said cavity wall being rigidly joined by solidified metal alloy which is disposed between said piston and said cavity walls but which is absent from said planar piston face.

2. The thermal conduction cooling module of claim 1 wherein said planar face has an area in contact with said chip to control thermal transmissibility, between said chip and said piston, which is interrupted by surface irregularities which tend to reduce the area of contact of said face with said chip.

3. The thermal conduction cooling module of claim 2 wherein said irregularities comprise grooves cut into said face, thereby reducing said area.

4. The thermal conduction cooling module of claim 2 wherein said irregularities comprise scoring cut into said face, thereby reducing said planar face area.

5. The thermal conduction cooling module of claim 2 wherein said irregularities comprise pits formed in said face, thereby reducing said planar face area.

6. The thermal conduction cooling module of claim 2 wherein said frame includes a plurality of flow paths, said plurality of flow paths including a plurality of injection channels, and a plurality of transverse cooling channels and a plurality of outflow channels, said channels being disposed in an orthogonal pattern, wherein each of said injection channels is connected to a plurality of outflow channels by said transverse cooling flow channels.

7. The thermal conduction cooling module of claim 6 wherein said injection channels extend into said frame substantially parallel to said cavities and intermediate said cavities, said outflow channels extend from within said frame to a top surface of said frame, and said transverse cooling flow channels orthogonally extend from one of said injection channels to one of said outflow channels.

8. The thermal conduction cooling module of claim 1 wherein said frame includes a plurality of flow paths, said plurality of flow paths including a plurality of injection channels, a plurality of transverse cooling channels and a plurality of outflow channels, said channels being disposed in an orthogonal pattern, wherein each of said injection channels is connected to a plurality of outflow channels by said transverse cooling flow channels.

9. The thermal conduction module of claim 1 wherein said frame includes a nozzle for delivering a cooling fluid to said piston, and so that said fluid impinges onto said piston on a face opposite to said planar face.

10. A thermal conduction cooling module for cooling at least one electronic chip having an exposed face, said cooling module comprising:

a frame with at least one cavity having walls extending from at least one surface of said frame into said frame;

at least one rigid piston, said piston having at least one planar face and positioned in said cavity with said planar face exposed and in thermal contact with said electronic chip;

said frame further including thermal conduction and transportation means for conducting heat from said piston and for transporting said heat so conducted away from said frame;

said rigid piston being slidably disposed in said cavity and being thermally connected to said cavity walls with a thermally conductive paste along the length of said piston, said piston being oriented in said cavity with said planar face disposed parallel to and in direct face-to-face contact with said exposed face of said electronic chip.

11. A thermal conduction module for cooling at least one electronic chip having an exposed face, said cooling module comprising:

a frame with at least one cavity having cavity walls extending from at least one surface of said frame into said frame;

at least one rigid piston, said piston having at least one planar face and being positioned in said cavity with said planar face exposed and in direct face-to-face thermal contact with said electronic chip;

said frame further including thermal conduction and transportation means for conducting heat from said piston and for transporting said heat so conducted away from said frame;

said rigid piston being a cup shaped member slidably disposed in said cavity and fixedly connected to said cavity walls with a bonding material which is disposed between said piston and said cavity walls, said piston being oriented in said cavity with said planar surface disposed parallel to and in direct face-to-face contact with said exposed face of said electronic chip.

12. The thermal conduction cooling module of claim 11 wherein said frame is fabricated from material of a rigid nature and said piston is fixedly attached by a bonding material comprising an epoxy compound.

13. The thermal conduction cooling module of claim 12 wherein said cup is sealed to said frame providing a fluid tight seal therebetween.

* * * * *